(12) United States Patent
Byeon

(10) Patent No.: US 7,916,540 B2
(45) Date of Patent: Mar. 29, 2011

(54) NON-VOLATILE MEMORY DEVICES AND SYSTEMS INCLUDING BAD BLOCKS ADDRESS RE-MAPPED AND METHODS OF OPERATING THE SAME

(75) Inventor: Dae Seok Byeon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 348 days.

(21) Appl. No.: 12/122,369

(22) Filed: May 16, 2008

(65) Prior Publication Data

US 2008/0285347 A1 Nov. 20, 2008

(30) Foreign Application Priority Data

May 17, 2007 (KR) .......................... 10-2007-0048123
Jun. 1, 2007 (KR) .......................... 10-2007-0053850

(51) Int. Cl.
*G11C 11/34* (2006.01)
(52) U.S. Cl. ............... 365/185.09; 365/200; 365/185.33
(58) Field of Classification Search ............. 365/185.09, 365/200, 185.33, 239, 51, 230.03, 230.06, 365/185.11, 185.18, 185.25, 222
See application file for complete search history.

(56) References Cited

U.S. PATENT DOCUMENTS

| | | | |
|---|---|---|---|
| 6,288,940 B1 | 9/2001 | Kawamura | |
| 6,625,071 B2 | 9/2003 | Ikeda et al. | |
| 7,539,896 B2 * | 5/2009 | Lakhani et al. | 714/8 |
| 2005/0162947 A1 * | 7/2005 | Kim et al. | 365/200 |
| 2009/0161430 A1 * | 6/2009 | Allen et al. | 365/185.09 |

FOREIGN PATENT DOCUMENTS

| | | |
|---|---|---|
| JP | 05-074191 | 3/1993 |
| JP | 2004-095001 | 3/2004 |
| JP | 2004-0145964 | 5/2004 |
| JP | 2005-0285184 | 10/2005 |
| KR | 10-1996-0008851 | 3/1996 |
| KR | 100205006 B1 | 3/1999 |
| KR | 10-0284904 B1 | 12/2000 |
| KR | 10-2003-0072433 A | 9/2003 |
| KR | 10-2004-0087245 A | 10/2004 |
| KR | 10-2007-0024249 A | 3/2007 |
| KR | 10-2007-0063132 A | 6/2007 |

* cited by examiner

*Primary Examiner* — Dang T Nguyen
(74) *Attorney, Agent, or Firm* — Myers Bigel Sibley & Sajovec, P.A.

(57) ABSTRACT

A method of operating a non-volatile memory device included in a memory card can be provided by re-mapping addresses of bad blocks in a first non-volatile MAT in a memory card and re-mapping addresses of bad blocks in a second non-volatile MAT in the memory card, the second non-volatile MAT including blocks that are address mapped with blocks in the first non-volatile MAT. Also a method of scanning a non-volatile memory device for bad blocks can be provided by sequentially scanning blocks in a non-volatile memory device for data indicating that a respective block is a bad block starting at a starting block address that is above a lowermost block address of the non-volatile memory device, wherein the starting block address is based on a yield for the non-volatile memory device.

22 Claims, 9 Drawing Sheets

NON-VOLATILE MEMORY DEVICES AND SYSTEMS INCLUDING BAD BLOCKS ADDRESS RE-MAPPED AND METHODS OF OPERATING THE SAME

CROSS-REFERENCE TO RELATED APPLICATIONS

This application claims priority from Korean Patent Application No. 10-2007-0048123, filed in the Korean Intellectual Property Office on May 17, 2007, and No. 10-2007-0053850, filed in the Korean Intellectual Property Office on Jun. 1, 2007, the disclosures of which are incorporated herein by reference in their entireties.

FIELD OF THE INVENTION

The present invention relates to the field of electronics, and more particularly, to non-volatile memories and the methods of operating non-volatile memories.

BACKGROUND

Memory devices can be structured to include an array with memory cell blocks and redundancy blocks, which can be used as substitutes for blocks that are determined to be defective. The substitution can be performed by a block selection circuit so that when substitution is called for, the block selection circuit selects from among the memory cell blocks beginning with the memory cell block having the highest address.

Non-volatile memories are also discussed in, for example, U.S. Pat. No. 6,956,769 B2.

SUMMARY

Embodiments according to the invention can provide non-volatile memory devices, memory cards, and systems including bad blocks address re-mapped between mats and methods of operating the same. Pursuant to these embodiments, a method of operating a non-volatile memory device can be provided by re-mapping addresses of bad blocks in a first non-volatile MAT in the non-volatile memory device and re-mapping addresses of bad blocks in a second non-volatile MAT in the non-volatile memory device, the second non-volatile MAT including blocks that are address mapped with blocks in the first non-volatile MAT.

In some embodiments according to invention, a method of scanning a non-volatile memory device for bad blocks can be provided by sequentially scanning blocks in a non-volatile memory device for data indicating that a respective block is a bad block starting at a starting block address that is above a lowermost block address of the non-volatile memory device, wherein the starting block address is based on a yield for the non-volatile memory device.

In some embodiments according to invention, a memory card can include a first non-volatile MAT, in the memory card, that includes an uppermost portion thereof with first replacement blocks having first bad blocks in the first non-volatile MAT re-mapped thereto. A second non-volatile MAT, in the memory card, can include an uppermost portion thereof with second replacement blocks having second bad blocks in the second non-volatile MAT re-mapped thereto.

In some embodiments according to invention, a non-volatile memory device can include a first non-volatile MAT that includes first bad blocks address re-mapped to first replacement blocks and a second non-volatile MAT that includes second bad blocks address re-mapped to second replacement blocks, where the second non-volatile MAT includes blocks that are address mapped with blocks in the first non-volatile MAT.

In some embodiments according to invention, a non-volatile memory device can include a first non-volatile MAT that includes first bad blocks and a second non-volatile MAT that includes second bad blocks, where the first and second bad blocks are address re-mapped to first and second redundant blocks respectively in an uppermost portion of the second non-volatile MAT.

DESCRIPTION OF EMBODIMENTS ACCORDING TO THE INVENTION

Figure 1:
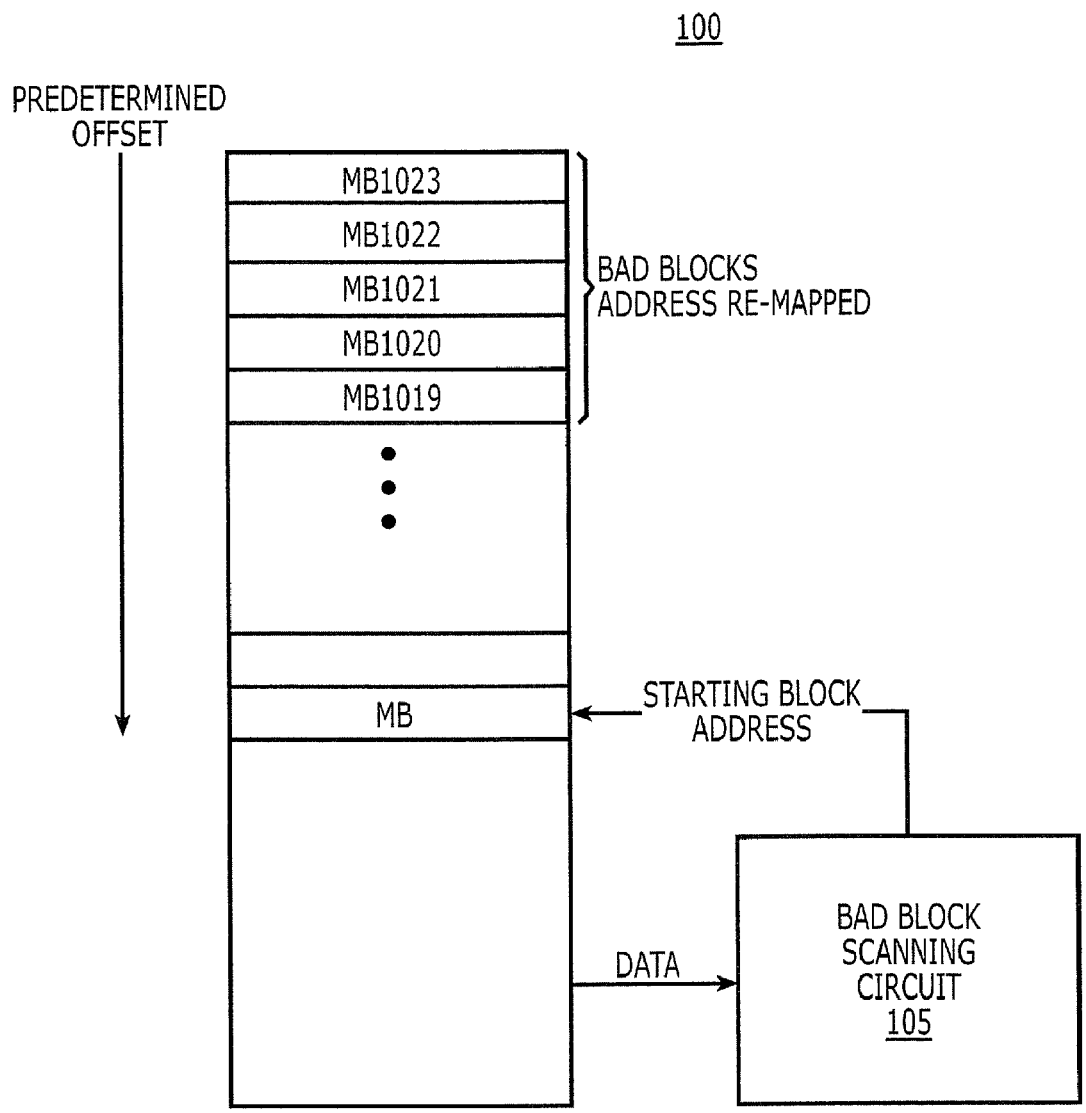
FIG. 1 is a schematic representation of a non-volatile memory device including memory blocks located at an uppermost portion of the address space in the non-volatile memory device which are allocated for bad block address re-mapping in some embodiments according to the invention.

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/ or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

As described herein below in greater detail, in some embodiments according to the invention, a partial scan of a non-volatile MAT can be performed when determining which blocks of the non-volatile MAT are allocated for replacement of bad blocks. For example, in some embodiments according to the invention, a predetermined offset can be used to index into the non-volatile MAT to a starting block address which is above the lowest most address in the non-volatile MAT.

The predetermined offset can be based on, for example, the yield associated with the device. For example, if the yield for the process used to fabricate the non-volatile MAT is about 2.5% (i.e., 2.5% of the blocks in the device may be bad) a partial scan may be initiated at a starting block address, which is about 2.5% of the address space below the uppermost address of the non-volatile MAT.

This partial scan approach may reduce the amount of time needed to scan for blocks that are currently allocated for use as replacement blocks in the non-volatile MAT. In some conventional systems, a scan may be initiated at the lowest most portion of the non-volatile MAT and is carried out up until the uppermost address of the non-volatile MAT is examined. Accordingly, in some embodiments according to the invention, the partial scan approach may eliminate a significant portion of the time which a conventional system may use to scan the entire non-volatile MAT by only scanning the portion of the non-volatile MAT which is likely to have bad blocks mapped thereto.

In some embodiments according to the invention, the partial scan approach may proceed until examination of a first block indicates that it is currently allocated for use as a replacement block for a bad block. Upon this determination, the partial scan approach may continue so that all remaining blocks (above the starting block address) are scanned for bad block replacement whereupon this partial scan may end. In other embodiments according to the invention, the partial scan approach may begin with the staring block address offset from the uppermost portion of the non-volatile MAT and proceed up through the upper most portion of the address space until the discovery of the first block that is allocated for use as a replacement block whereupon the partial scan can terminate by marking all remaining unscanned blocks as being allocated for bad block replacement.

As appreciated by the present inventor, upon start up of a system including a non-volatile memory, an initial scan may be performed by the user's system to determine which blocks in the non-volatile memory are currently allocated for use as replacement blocks. In operation, the replacement blocks are typically substituted for blocks in the non-volatile memory which are known to be bad. Upon access to an address of a bad block, the memory controller can instead access an associated replacement block that is allocated for use with the bad block address. Accordingly, as used herein, this association of replacement blocks with known bad blocks in the non-volatile memory is sometimes referred to as address re-mapping. For example, it can be said that when a replacement block is accessed rather than an addressed bad block, the bad block has been address re-mapped to the replacement block.

In still further embodiments according to the invention, multiple non-volatile MATs can be address mapped together with one another. For example, in some embodiments according to the invention, two MATs can be address mapped together so that both of the MATs taken together provide a contiguous address space. In some embodiments according to the invention, the MATs are configured to provide a linear address space so that one of the MATs provides a lower most portion of the contiguous address space and the second MAT provides an immediately adjacent upper portion of the contiguous address space. In other embodiments according to the invention, blocks in the first and second MATs can be address interleaved with one another so that even block addresses are directed to the first MAT whereas odd block addresses are directed to the second MAT that is address interleaved with the first MAT.

In each of these configurations (using either the linear or interleaved address mapping) the respective uppermost portion of each of the MATs can be allocated for use as replacement blocks associated with known bad blocks located into the respective MATs. Furthermore, the partial scan approach described herein can also be used in conjunction with the multiple non-volatile MATs that are addressed mapped together.

In still further embodiments according to the invention, replacement blocks can be allocated at an upper most portion of an address space of one of the two MATs that are address mapped together. In particular, the non-volatile MAT having the replacement blocks allocated therein actually provides the replacement blocks for bad blocks in each of the MATs. For example, in some embodiments according to the invention, known bad blocks in a first MAT can be address re-mapped to replacement blocks that are located in an uppermost portion of the address space of the second MAT. In response to an access to the first MAT, replacement signals (configured to activate the replacement blocks associated with the addressed bad blocks) are provided by a bad block replacement controller circuit that is associated with a second MAT. In still other embodiments according to the invention, the replacement signals can be provided by a block replacement controller circuit that is associated with the MAT that was accessed.

FIG. 1 is a schematic illustration of a non-volatile MAT 100 including memory blocks MB1019-MB1023 allocated for use as replacement blocks for known bad blocks in the non-volatile MAT 100. It will be understood that the non-volatile MAT 100 has been previously scanned to determine which of the blocks included therein is inappropriate for use to store data (i.e., a bad block). Further, the known bad blocks have been previously address re-mapped to replacement blocks located in an uppermost portion of the address space of the non-volatile MAT 100 represented by the memory blocks MB1019-MB1023.

It will be understood that, as used herein, the term "MAT" refers to non-volatile memory devices, memory cards and/or memory systems that include non-volatile memory devices (or blocks) that can be accessed independently of one another. For example, two MATs may have separate address decoding circuits associated therewith so that the two MATs can receive accesses to different block addresses. Furthermore, the term MAT can include any type of memory block that can be accessed independently of other memory blocks in a system.

When a user's system re-initiates a memory system including the non-volatile MAT 100, a bad block table (indicating which of the blocks is bad and which of the replacement blocks is associated therewith) should be reconstructed by scanning the non-volatile MAT 100 for blocks which are designated as being allocated as replacement blocks for the known bad blocks. Accordingly, a bad block scanning circuit 105 provides a starting block address to the non-volatile MAT 100 for initiation of a partial scan of a non-volatile MAT 100.

It will be understood that the bad block scanning circuit 105 sequentially examines memory blocks MB beginning with the starting block address to determine if the memory block MB being accessed is allocated for use a replacement block. The starting block address is provided by an offset into the non-volatile MAT 100 from an upper most memory block MB 1023. Further, the bad block scanning circuit 105 increments the starting block address to provide a new current address for each sequential access to the memory blocks located above the starting block address.

Figure 2:
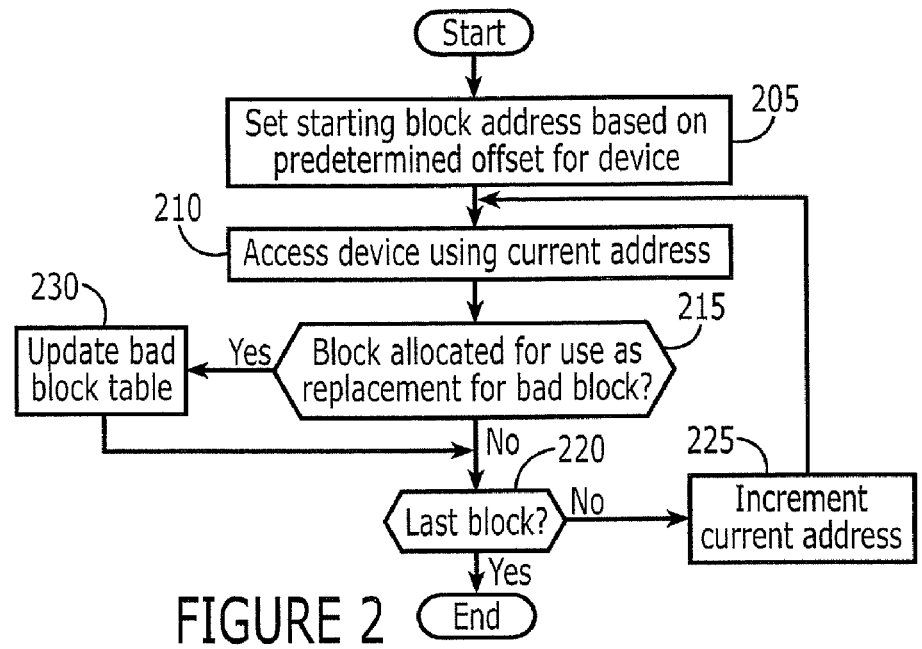
FIGS. 2 and 3 are flowcharts that illustrate operations of partial scanning for blocks allocated for bad block replacement in non-volatile memory devices in some embodiments according to the invention.

FIG. 2 is a flow chart that illustrates operations of the bad block scanning circuit 105 shown in FIG. 1 in some embodiments according to the invention. According to FIG. 2, the bad block scanning circuit 105 sets the starting block address based on a predetermined offset for the non-volatile MAT 100 (block 205). As described herein, the predetermined offset from the uppermost memory block into the non-volatile MAT 100 can be based on the yield for the process that fabricated the non-volatile MAT 100. For example, if the yield for the process is estimated to be such that about 2.5% of 2048 memory blocks in the device are expected to be bad, the predetermined offset for such a non-volatile MAT can be about 50 (i.e., 2.5% of 2048). Accordingly, the bad block scanning circuit 105 can offset from the uppermost block in to the non-volatile MAT 100 by 50 addresses to provide a starting block address of 1998.

Once the starting block address is provided, the bad block scanning circuit 105 accesses the non-volatile MAT 100 using the current address, which on first access is equal to the starting block address (block 210). The access to the non-volatile memory MAT 100 provides data to the bad block scanning circuit 105. The bad block scanning circuit 105 examines the data retrieved from the accessed memory block to determine whether the accessed memory block has been previously allocated for use as a replacement block for a known bad block (block 215). In some embodiments according to the invention, each of the memory blocks can include a dedicated field that can indicate whether the block is currently allocated for use as a replacement block for a known bad block.

If the bad block scanning circuit 105 determines that the currently accessed memory block is allocated for use as a replacement block (block 215), the bad block scanning circuit 105 updates the bad block table to indicate that the currently accessed memory block is allocated for use as a replacement block (block 230). Otherwise the bad block scanning circuit 105 determines that the accessed memory block is not currently allocated as a replacement block (block 215).

The bad block scanning circuit 105 then determines whether the currently accessed memory block is the last memory block to be examined in the non-volatile MAT 100 (block 220). If the bad block scanning circuit 105 determines that additional memory blocks are to be examined, the current address used to access the non-volatile MAT 100 is incremented (block 225), whereupon operations continue at block 210. If, however, the bad block scanning circuit 105 determines that no additional memory blocks are to be scanned (block 220), operations end.

Figure 3:
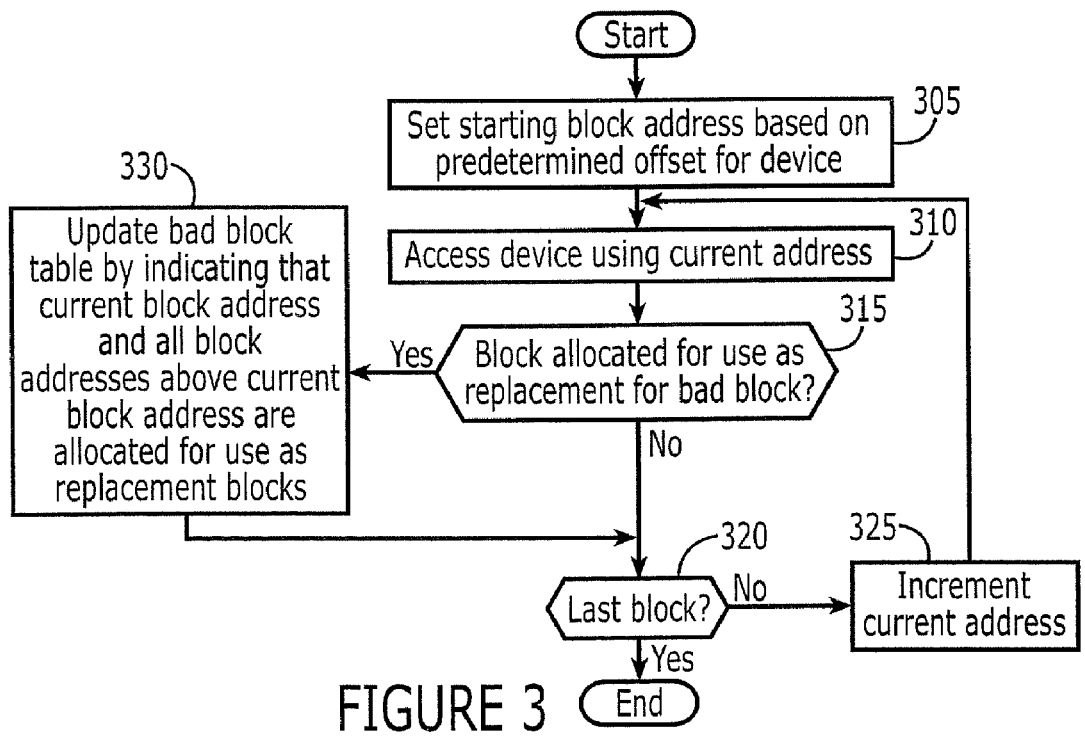

FIG. 3 is a flowchart that illustrates operations of the bad block scanning circuit 105 shown in FIG. 1 in some embodiments according to the invention. According to FIG. 3, the bad block scanning circuit 105 sets the starting block address based on the predetermined offset for the non-volatile MAT 100 as described above in reference to FIG. 2 (block 305). The bad block scanning circuit 105 accesses the non-volatile MAT using the current address, which on the first access is equal to the starting block address (block 310). It will be understood that the bad block scanning circuit 105 can use the approach described above in reference to FIG. 2 to determine whether the current accessed memory block is allocated for use as a replacement block for a known bad block in the non-volatile MAT.

If the bad block scanning circuit 105 determines that the currently accessed block is allocated for use as a replacement block for a known bad block (block 315), the bad block scanning circuit 105 can update the bad block table to show that the currently accessed memory block is allocated for use as a replacement block for a known bad block in the non-volatile MAT 100, and further, that all blocks above the current address are similarly allocated for use as replacement blocks for known bad blocks in the non-volatile MAT (block 330). Thereafter, the bad block scanning circuit 105 can avoid any further access to the non-volatile MAT for the purposes of determining which blocks are allocated as replacement blocks as all blocks above the current address are presumed to be allocated for use as replacement blocks.

If the bad block scanning circuit 105 determines that the currently accessed memory block is not allocated for use as a replacement block (block 315), the bad block scanning circuit 105 determines whether additional blocks (above the currently addressed memory block) are to be scanned (block 320). If additional blocks are to be scanned, the bad block scanning circuit 105 increments the current address (block 325), whereupon operations resume at block 310.

As shown above in FIG. 3, the bad block scanning circuit 105 can scan the non-volatile MAT 100 until a memory block is discovered that is allocated for use as a replacement block whereupon all blocks located above the current address and an uppermost address of the non-volatile MAT 100 can be assumed to all to be allocated for use as replacement blocks so that further scanning by the bad block scanning circuit 105 can be avoided. Accordingly, the approaches outlined above in reference to FIGS. 1-3 can reduce the amount of time that may otherwise be used to scan an entire non-volatile MAT 100 by beginning the scan for blocks allocated for use as replacement blocks using a predetermined offset into the non-volatile MAT 100 from the uppermost memory block. Furthermore, the predetermined offset can be based upon the yield of the process used to fabricate the non-volatile MAT 100.

In some embodiments according to the invention, it will be understood that if the bad block scanning circuit 105 determines that the memory block located at the starting block address is allocated for use as a replacement block, the bad block scanning circuit 105 can add to the predetermined offset to index deeper into the non-volatile MAT 105 to reduce the likelihood that some blocks that are allocated for use as replacement blocks may be overlooked during the partial scan. This process can be repeated until the access using the starting block address indicates that the currently accessed block is not allocated for use as a replacement block whereupon further processing would proceed as described above in reference to FIGS. 2 and/or 3.

Figure 4:
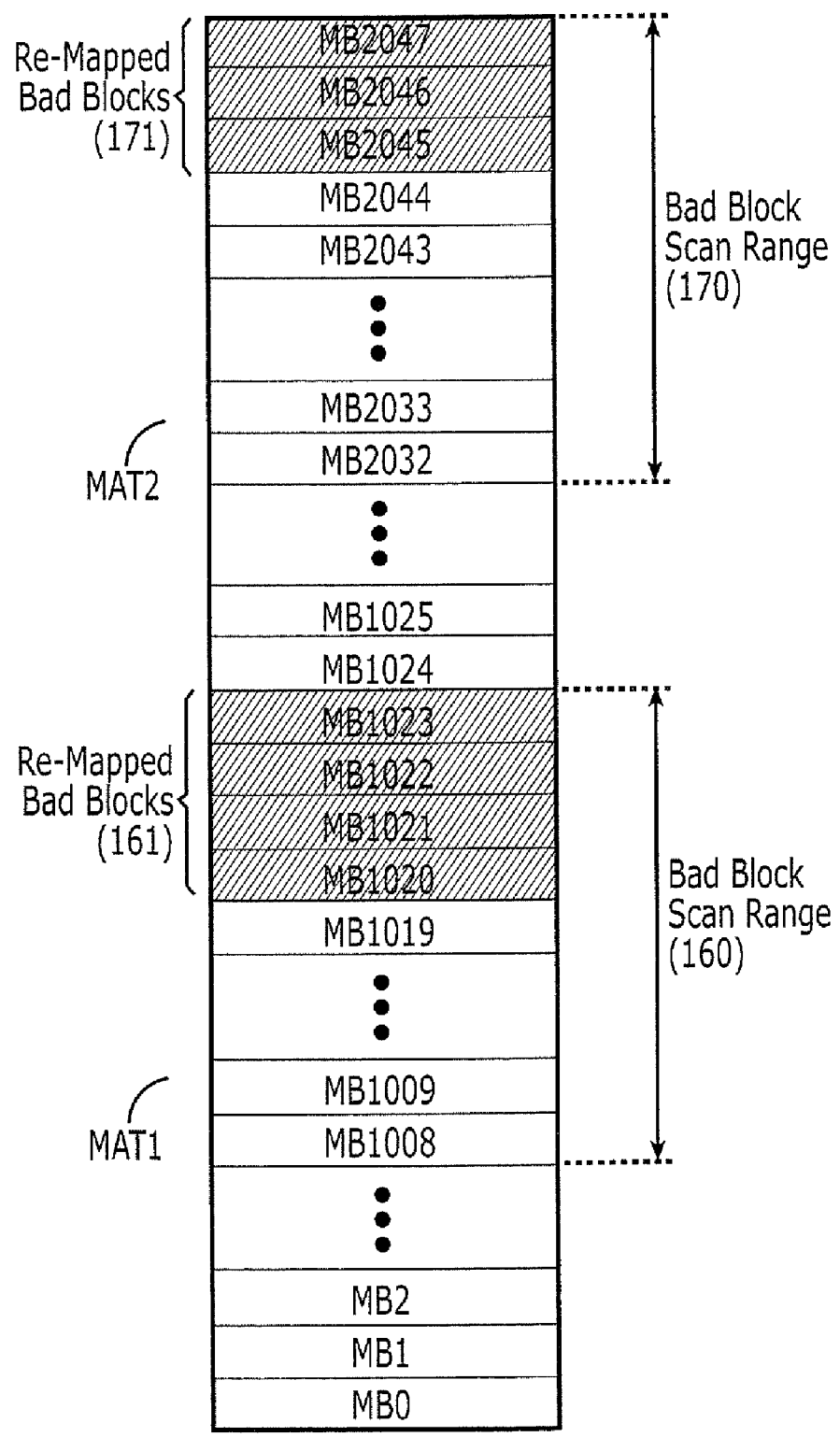
FIG. 4 is a schematic representation of first and second non-volatile memory MATs having the uppermost portions of the respective address spaces therein allocated for bad block replacement and each having respective partial scans operated thereon in some embodiments according to the invention.

FIG. 4 is a schematic illustration of multiple MATs providing respective portions of a linear address mapped space where each of the MATs includes a number of replacement blocks identified using a partial scan in each of the MATs as described above with reference to FIGS. 1-3. In particular, MAT 1 can be processed using the bad block scanning circuit 105 that starts at MB1008 and proceeds sequentially toward MB1023 (identified as an uppermost block of the non-volatile MAT 1).

Similarly, MAT 2 can also be scanned using the bad block scanning circuit 105 starting at memory block 2032 and sequentially examining the memory blocks up to MB2047. Accordingly, embodiments according to the invention employing the partial scans described herein can be utilized to partially scan multiple MATs which are address mapped together to provide a contiguous address range that address space in a non-volatile memory device.

Figure 5:
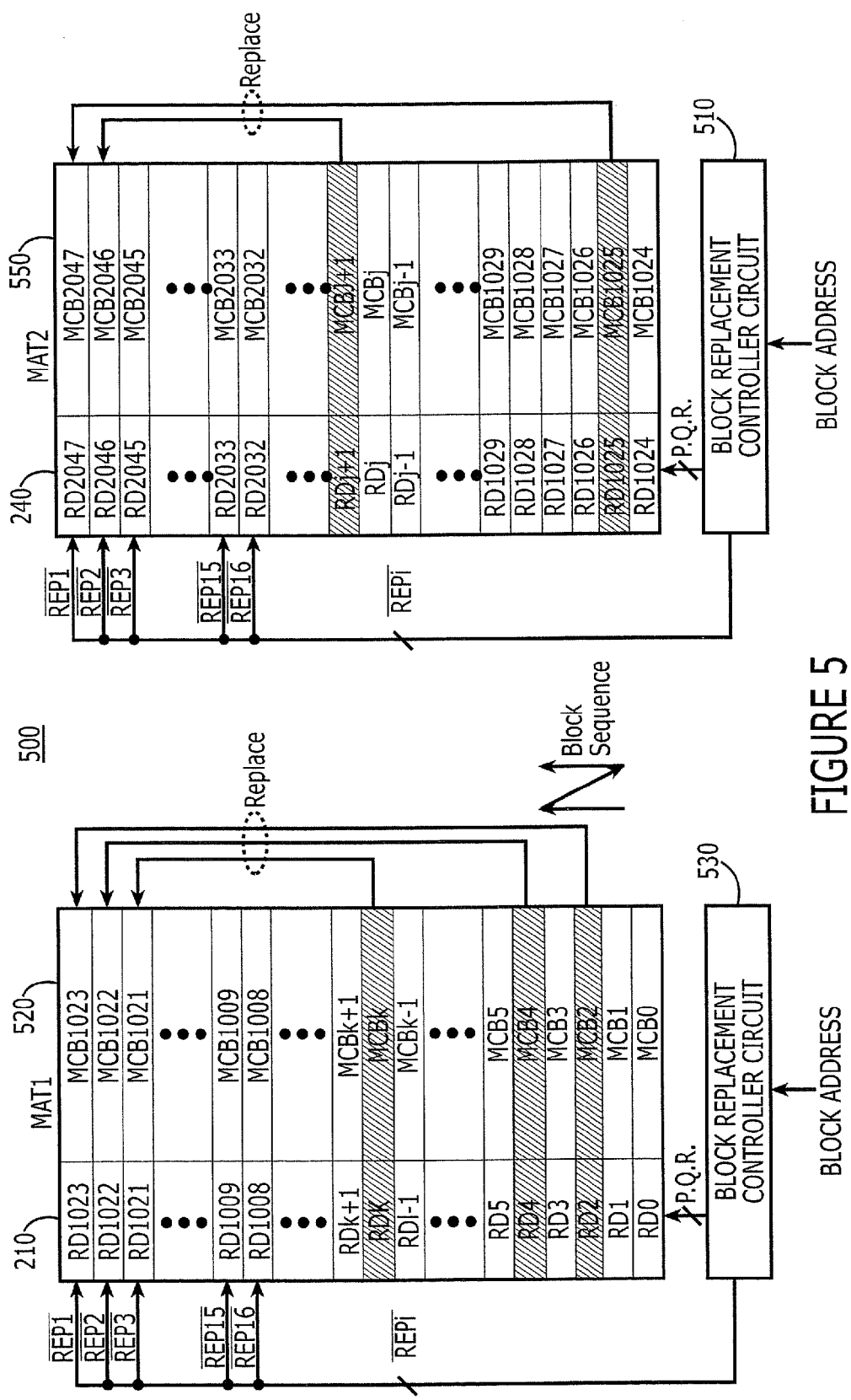
FIG. 5 is a schematic representation of two MATs address mapped together with one another to provide a linear address space wherein uppermost portions of the respective address spaces within the MATs are allocated for bad block replacement in some embodiments according to the invention.

FIG. 5 is a schematic illustration of two MATs each including memory blocks located at respective uppermost portions of the memory spaces for MAT 1 and MAT 2 allocated for use as replacement blocks for known bad blocks in some embodiments according to the invention. According to FIG. 5, a non-volatile memory system 500 includes a first non-volatile MAT 520 and a second non-volatile MAT 550. It will be understood that the first MAT 520 and the second MAT 550 are address mapped together to provide a linear address space including the memory blocks MCB0-MCB2027. More particularly, an uppermost memory block MCB1023 included in the first MAT 520 is located immediately below the lowest most block MCB1024 in address space of the second MAT 550. Accordingly, the first and second non-volatile MATs 520 and 550 provide a continuous address space spanning from MCB0 to MCB2047.

Further, each of the first and second MATs 520 and 550 are accessed using a respective block replacement controller circuit 530 and 560. A first block replacement controller circuit 530 receives a block address that can be used to access the first MAT 520 included within the entire address space provided by the combination of the first and second MATs 520 and 550. In response, the block replacement controller circuit 530 can issue a corresponding replacement signal to a block that is allocated for use as a replacement for a known bad block in MAT 520. For example, as shown in FIG. 5, the block replacement controller circuit 530 can issue replacement signals 1-16 to access any one of memory blocks MCB1008-MCB1023, each of which is respectively allocated for use as a replacement block for a respective known bad block in the MAT 520.

As an example of the address re-mapping provided by the block replacement controller circuit 530, the known bad block MCB2 is address re-mapped so that block MCB1023 is provided as replacement therefore. Similarly, known bad blocks MCB4 and MCBk are address re-mapped to replacement blocks MCB1022 and MCB1021 respectively. Accordingly, when the block replacement controller circuit 530 detects a block address provided thereto that matches a known bad block address, the appropriate replacement block associated with the known bad block is activated via the replacement signals. Accordingly, the replacement block rather than the known bad block is accessed for storing and retrieving data.

It will be understood that the second MAT 550 and the associated block replacement controller circuit 560 associated therewith operate substantially the same as that described above in reference to the first MAT 520. It will be understood, however, that as described herein, the first and second MATs 520 and 550 are address mapped together so that the contiguous address space is provided from MCB0 to MCB2047.

Figure 6:
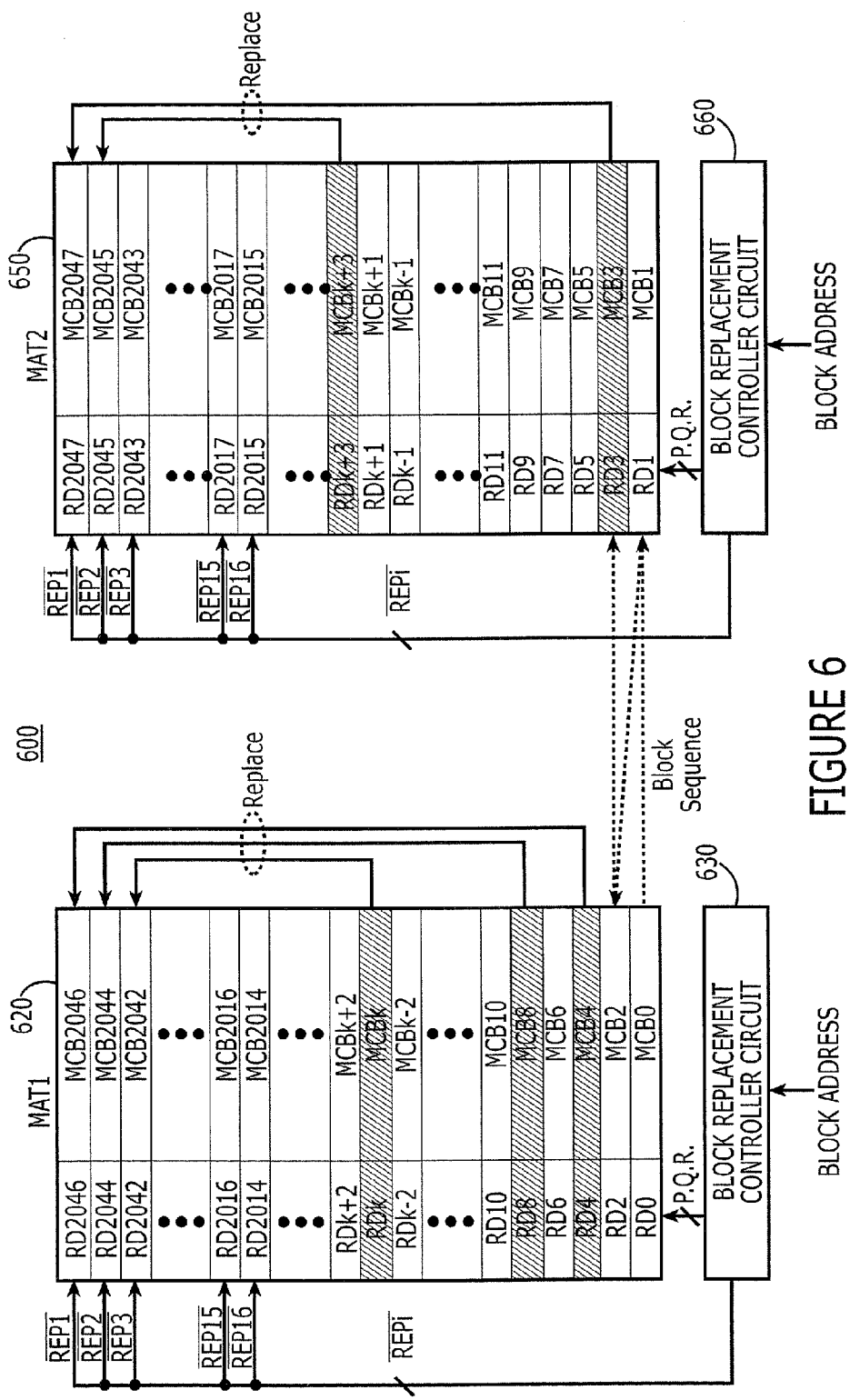
FIG. 6 is a schematic representation of two MATs address mapped together in an interleaved fashion wherein each of the MATs includes an uppermost portion of the respective address space that is allocated for bad block replacement in some embodiments according to the invention.

FIG. 6 is a schematic illustration of a non-volatile memory device 600 including first and second non-volatile MATs 620 and 650 that are address mapped together to provide a contiguous address space from the first memory block MCB0 to an uppermost memory block MCB2047 in some embodiments according to the invention. Further, it will be understood that the first and second non-volatile MATs 620 and 650 are address mapped together in an interleaved configuration so that, for example, the first non-volatile MAT 620 is accessed on even addresses whereas the second non-volatile MAT 650 is accessed on odd addresses. Accordingly, even block addresses are handled by a block replacement controller circuit 630 whereas odd block addresses are handled by a block replacement controller circuit 660.

It will be understood that the operations described above in reference to FIG. 5 substantially apply to the arrangement in FIG. 6. For example, the generation of replacement signals by the respective block replacement controller circuits is substantially the same as shown in FIG. 5. It will be further understood that the lowest most bit of the block address may be used to activate either of the block replacement controller circuits 630 and 660 to access the appropriate non-volatile MAT 620 or 650. In particular, a "0" in the least significant bit of the block address can activate the block replacement controller circuit 630 used to access the first non-volatile MAT 620, whereas a "1" in the least significant bit of the block address can be used to activate the block replacement controller circuit 660 to access the second non-volatile MAT 650.

Figure 7:
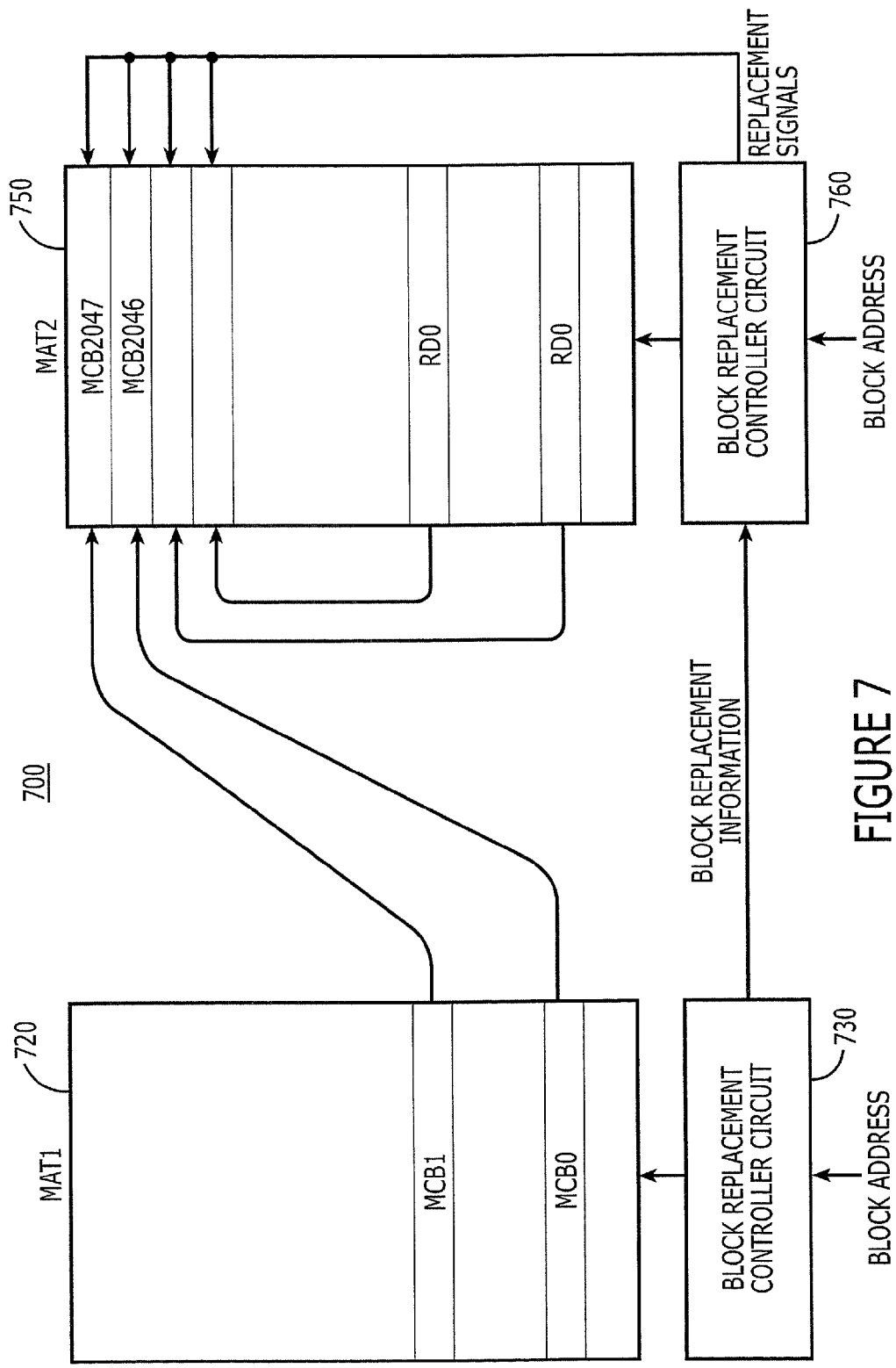
FIG. 7 is a schematic representation of two MATs addressed mapped together to provide either a linear or interleaved address space in an uppermost portion of the address space in MAT2 allocated for replacement of bad blocks included in MAT1 and MAT2.

FIG. 7 is a schematic illustration of a non-volatile memory system 700 including first and second non-volatile MATs 720 and 750 address mapped together to provide a contiguous address space from MCB0 to MCB2047 in some embodiments according to the invention. According to FIG. 7, known bad blocks included in the first non-volatile MAT 720 are address re-mapped to an uppermost portion of the address space of the second non-volatile MAT 750. Further, known bad blocks in the second MAT 750 are also address re-mapped to the uppermost portion of the address space in the second MAT 750. Accordingly, a memory access to the first non-volatile MAT 720 via a block replacement controller circuit 730 can provide block replacement information to the block replacement controller circuit 760 associated with the second non-volatile MAT 750.

In turn, the block replacement controller circuit 760 can provide the replacement signals to activate the appropriate replacement blocks to which the known bad blocks of the first non-volatile MAT 720 are address re-mapped. For example, if a block address provided to the block replacement controller circuit 730 specifies a known bad block address in the first non-volatile MAT 720, the block replacement controller circuit 730 provides block replacement information to the block replacement controller circuit 760 (that is associated with the second non-volatile MAT 750). In response, the block replacement controller circuit 760 asserts the replacement signal for MCB2046 that is allocated as the replacement block for known bad block MCB0 specified by the block address provided to the block replacement controller circuit 730.

In some embodiments according the invention, the block replacement information can include a portion of or the entire block address. In some embodiments according the invention, the block replacement information can include an indication of which replacement signal is to be activated. In some embodiments according to the invention, the block replacement information can be a signal indicating that the block replacement controller circuit 750 should latch the block address present at its inputs (for use in activating the correct replacement signal).

Figure 8:
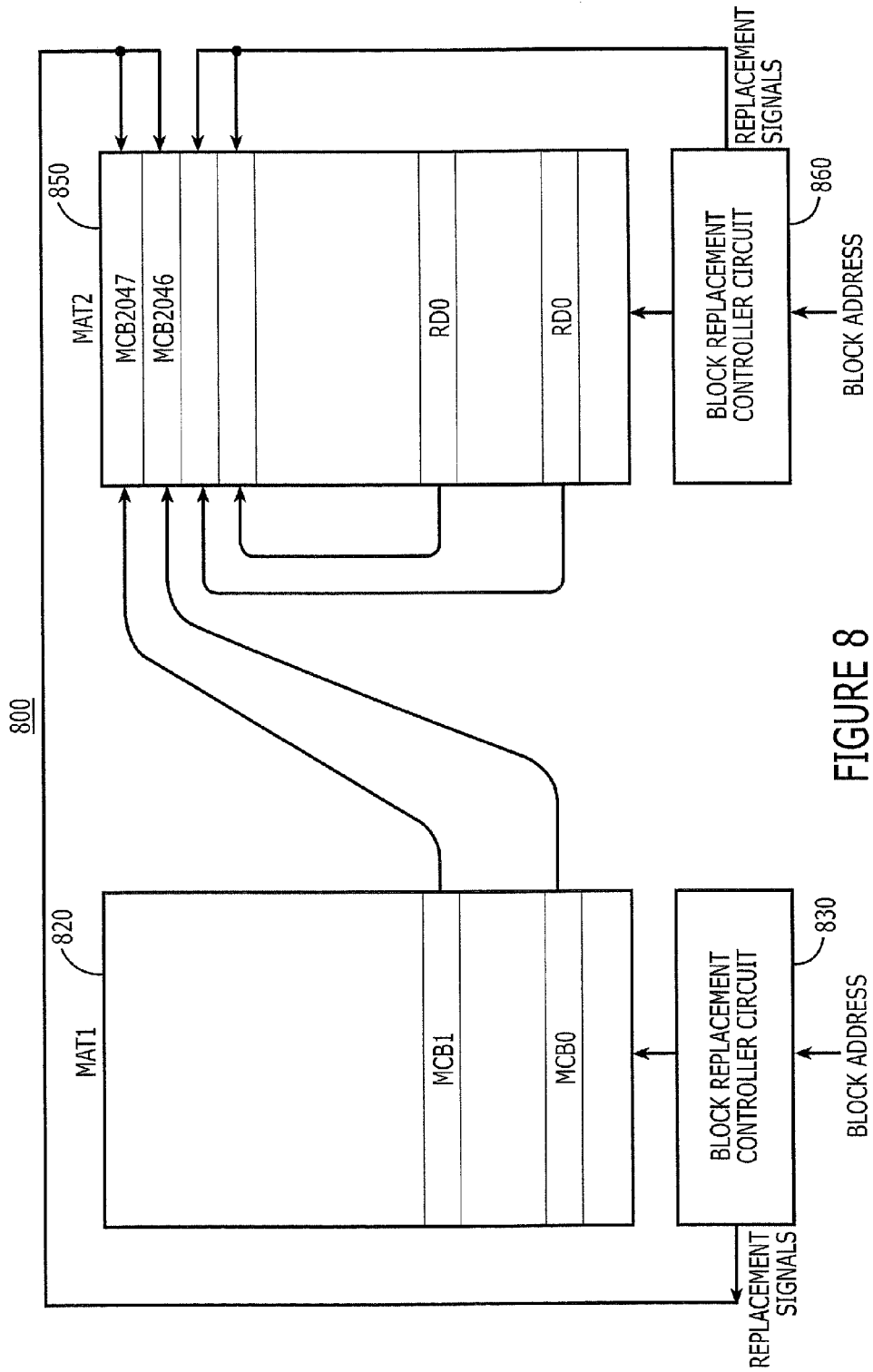
FIG. 8 is a schematic representation of two MATs address mapped together in either a linear or interleaved configuration wherein an uppermost portion of the address space of the second MAT is allocated for replacement of bad blocks located in both the first and second MATs based on replacement signals generated by either a first or second block replacement controller circuit associated with the first or second MAT respectively.

FIG. 8 is a schematic representation of a non-volatile memory system 800 including first and second non-volatile MATs 820 and 850. According to FIG. 8, the first and second MATs 820 and 850 are address mapped together to provide a contiguous address space for the non-volatile memory system 800. Furthermore, known bad blocks included in the first non-volatile MAT 820 are address re-mapped to an uppermost portion of the second non-volatile MAT 850. Known bad blocks included in the second non-volatile MAT 850 are also address re-mapped to the uppermost portion of the address space in the second non-volatile MAT 850 along with the known bad blocks included in the first non-volatile MAT 820, as similarly described above in reference to FIG. 7.

As further shown in FIG. 8, replacement signals used to activate the replacement blocks allocated for bad blocks in the first non-volatile MAT 820 are provided by the block replacement controller 830 associated with the first non-volatile MAT 820, whereas replacement signals used to activate the replacement blocks allocated to bad blocks in the second non-volatile MAT 850 are provided by a block replacement controller 860 associated with the second non-volatile MAT 850.

Figure 9:
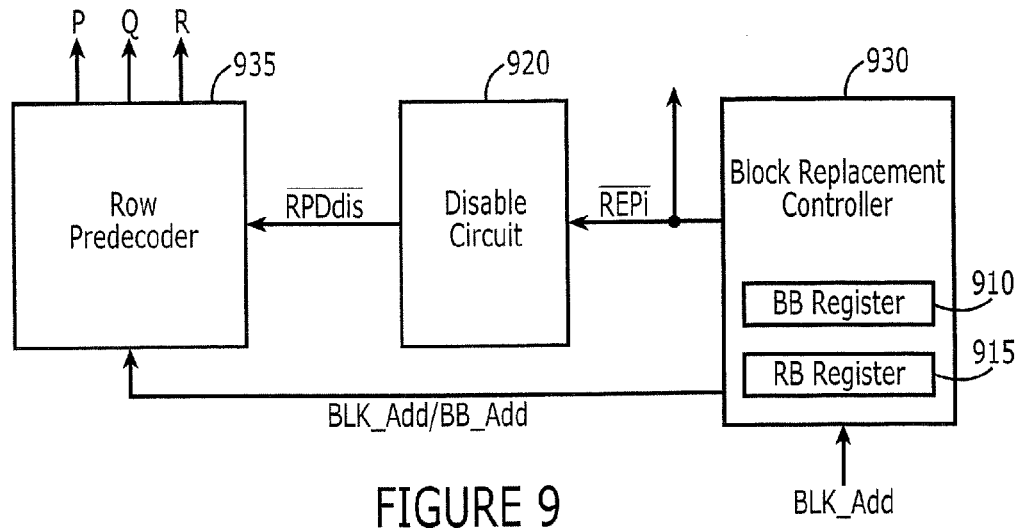
FIG. 9 is a schematic representation of a bad block replacement controller circuit in some embodiments according to the invention.

FIG. 9 is a schematic representation of a portion of the block replacement controller circuit 930 as shown above in FIGS. 5-8 according to some embodiments according to the invention. According to FIG. 9, the block replacement controller circuit 930 includes a set of bad block registers 910 and an associated set of replacement block registers 915. The block replacement controller circuit 930 issues a set of replacement signals that can be used to activate blocks of the non-volatile MATs that are allocated for use as replacement blocks for known bad blocks therein. Further, the block replacement controller circuit 930 can provide a block address/bad block address to a row predecoder 935 that can be used to access a memory block identified by the block address.

As further shown in FIG. 9, a disable circuit 920 can receive the replacement signals provided by the block replacement controller circuit 930 to disable the row predecoder 935 when a bad block address is provided to the block replacement controller circuit 930. Accordingly, when a bad block address is provided for access, the block replacement controller circuit 930 activates an appropriate replacement signal for replacement block while the disable circuit 920 disables the predecoding provided by the row predecoder 935 to avoid activating the block which has previously been identified as bad.

Figure 10:
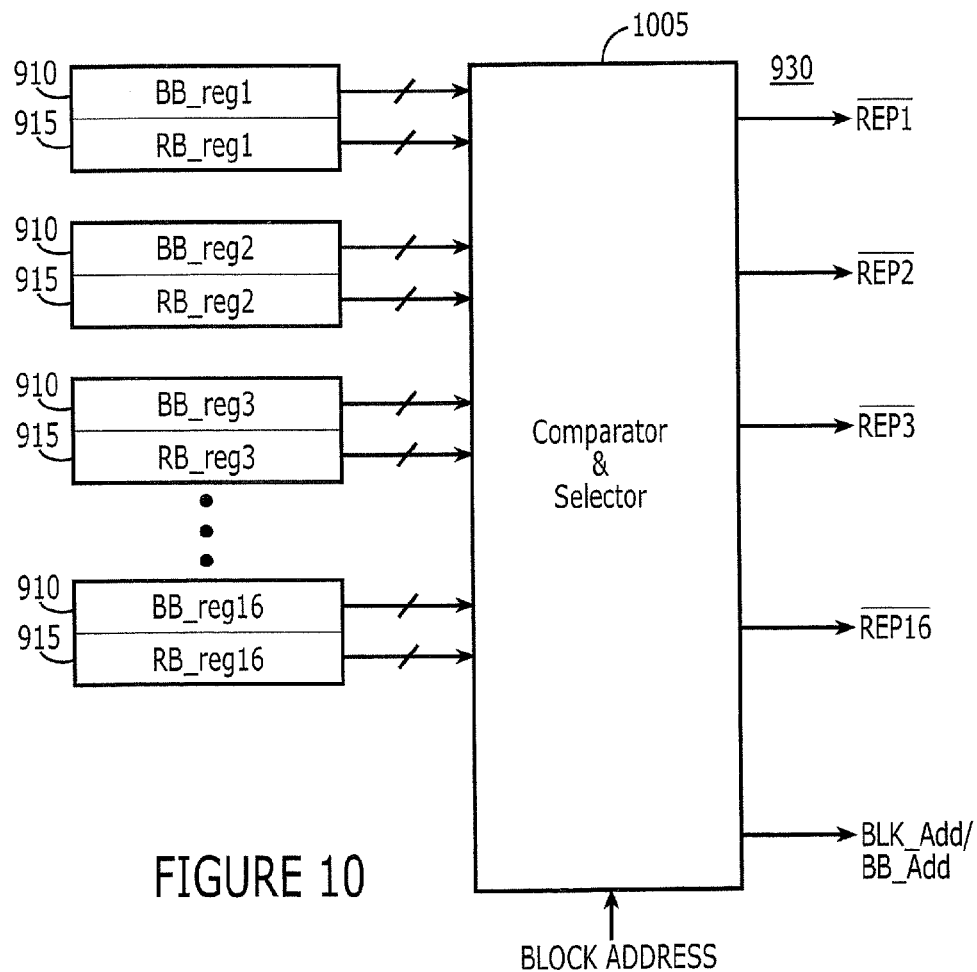
FIG. 10 is a schematic representation of a more detailed view of a block replacement controller circuit including bad block address registers and associated replacement block address registers in some embodiments according to the invention.

FIG. 10 is a schematic representation of a further portion of the block replacement controller circuit 930 shown in FIG. 9 in some embodiments according to the invention. According to FIG. 10, the block replacement controller circuit 930 includes a comparator and selector circuit 1005 which is configured to compare a received block address to known bad block addresses included in the bad block registers 910. If the comparator and selector circuit 1005 determines that the block address matches one of the addresses of a known bad block included in one of the bad block registers 910, the comparator and selector circuit 1005 accesses an associated replacement block register 915 to determine which of the replacement signals (REP1-RLP16) to activate.

Once the appropriate replacement signal is activated, the replacement block allocated for the known bad block is activated rather than the block identified by the block address. As described above with reference to FIG. 9, the block replacement controller circuit 930 can also disable the row predecoder 935 from activating the known bad block despite the fact that the block address identifies the address to be accessed as the known bad block.

Figure 11:
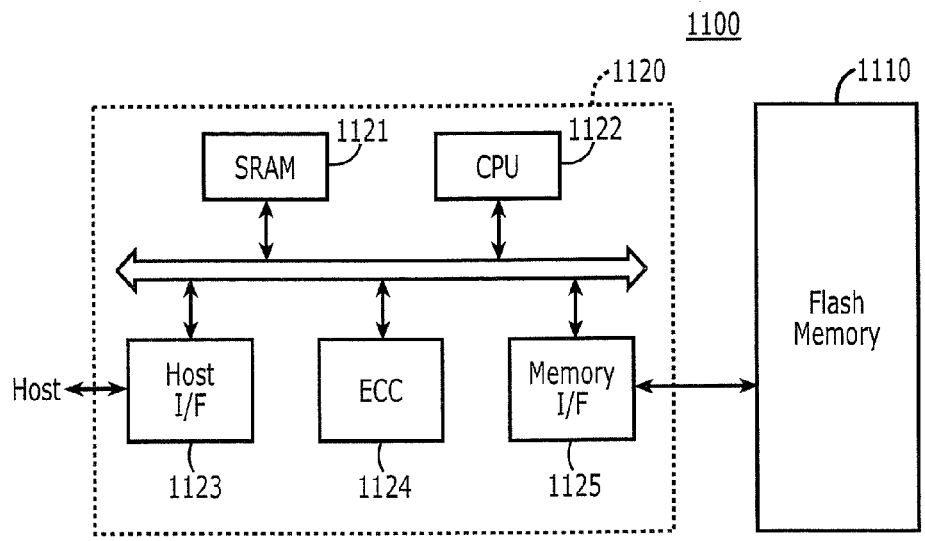
FIG. 11 is schematic representation of a memory card including a non-volatile memory including MATs in some embodiments according to the invention.

FIG. 11 is a schematic representation of a memory card 1100 including a flash memory device 1110 in some embodiments according to the invention. According to FIG. 11, the flash memory 1110 is coupled to a memory controller 1120 that includes a CPU 1122 that is configured to coordinate general operations of each of the components included in the memory controller 1120. The memory controller 1120 also includes a host interface (I/F) 1123 that can be used to access a remote host, and an error checking and correction circuit (ECC) 1124 that can be used to protect data, for example, in an SRAM 1121 that the CPU 1122 can use to store data and commands used to operate the memory controller 1120. The memory controller 1120 also includes a memory interface 1125 that provides access to the flash memory 1110, as described herein in some embodiments according to the invention.

Figure 12:
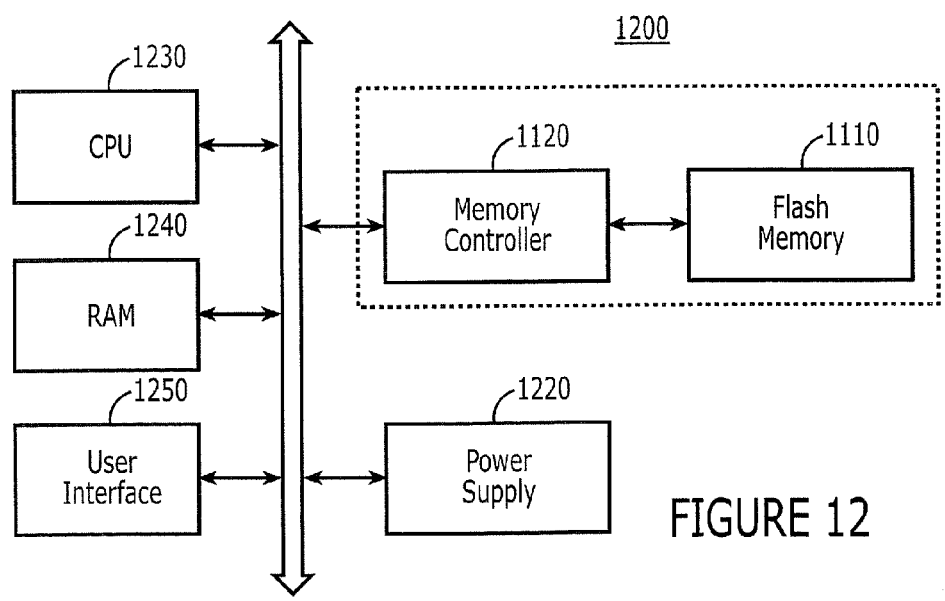
FIG. 12 is schematic representation of a memory system including non-volatile MATs in some embodiments according to the invention.

FIG. 12 is a schematic representation of a memory system 1200 including the memory controller 1120 and the flash memory 1110 as described in reference to FIG. 11. The memory system 1200 also includes a general operation processor 1230 that is used to coordinate operations of each of the subsystems included in the memory system 1200. The memory system 1200 also includes a random access memory (RAM) 1240 that can be used by the CPU 1230 to store data and commands used to operate the memory system 1200. The memory system 1200 also includes a user interface 1250 that may allow a user to direct operations of the memory system 1200.

Further, the memory system 1200 includes a power supply 1220 that can provide power for each of the subsystems included in the memory system 1200. It will be understood that the memory system 1200 can be embodied in any type of memory system, such as a memory card, a solid state disc, a camera image processor an application chip set or the like. Further, the memory system 1200 (and the memory card 1100) can be mounted in various package types, such as a ball grid array, a chip scale package, a plastic leaded chip carrier, a plastic dual in-line package, a multi-chip package, a wafer level fabricated package, a wafer level processed stack package, or the like.

As described herein, in some embodiments according to the invention, a partial scan of a non-volatile MAT can be performed when determining which blocks of the non-volatile MAT are allocated for replacement of bad blocks. For example, in some embodiments according to the invention, a predetermined offset can be used to index into the non-volatile MAT to a starting block address which is above the lowest most address in the non-volatile MAT.

The predetermined offset can be based on, for example, the yield associated with the device. For example, if the yield for the process used to fabricate the non-volatile MAT is about 2.5% (i.e., 2.5% of the blocks in the device may be bad) a partial scan may be initiated at a starting block address, which is about 2.5% of the address space below the uppermost address of the non-volatile MAT.

In other embodiments according to the invention, multiple non-volatile MATs can be address mapped together with one another. For example, in some embodiments according to the invention, two MATs can be address mapped together so that both of the MATs taken together provide a contiguous address space. In some embodiments according to the invention, the MATs are configured to provide a linear address space so that one of the MATs provides a lower most portion of the contiguous address space and the second MAT provides an immediately adjacent upper portion of the contiguous address space. In other embodiments according to the invention, blocks in the first and second MATs can be address interleaved with one another so that even block addresses are directed to the first MAT whereas odd block addresses are directed to the second MAT that is address interleaved with the first MAT.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of operating a non-volatile memory device, the method comprising:
   re-mapping addresses of bad blocks in a first non-volatile MAT in the non-volatile memory device; and
   re-mapping addresses of bad blocks in a second non-volatile MAT in the non-volatile memory, the second non-volatile MAT including blocks that are address mapped with blocks in the first non-volatile MAT, wherein the addresses of the bad blocks in the first and second non-volatile MATs are re-mapped to an uppermost portion of the second non-volatile MAT included in the non-volatile memory device.

2. The method according to claim 1 wherein the addresses of the bad blocks in the first non-volatile MAT are re-mapped to an uppermost portion of the first non-volatile MAT included in the non-volatile memory device; and
   wherein the bad blocks in the second non-volatile MAT are re-mapped to an uppermost portion of the second non-volatile MAT included in the non-volatile memory device.

3. The method according to claim 1 further comprising:
   providing bad block replacement information for the bad blocks in the first non-volatile MAT to a block replacement controller circuit configured to control block selection for the second non-volatile MAT during an access to the first non-volatile MAT.

4. The method according to claim 1 further comprising:
   providing replacement signals from a block replacement controller circuit configured to control block selection for the first non-volatile MAT to replacement blocks in the second non-volatile MAT having the bad blocks in the first non-volatile MAT re-mapped thereto.

5. The method according to claim 1 wherein addresses of the blocks in the first non-volatile MAT are interleaved with addresses of the blocks in the second non-volatile MAT.

6. A method of operating a non-volatile memory device, the method comprising:
   re-mapping addresses of bad blocks in a first non-volatile MAT in the non-volatile memory device; and
   re-mapping addresses of bad blocks in a second non-volatile MAT in the non-volatile memory, the second non-volatile MAT including blocks that are address mapped with blocks in the first non-volatile MAT, wherein addresses of the blocks in the second non-volatile MAT are sequentially mapped immediately above a respective uppermost block in the first non-volatile MAT or immediately below a respective lowermost block in the first non-volatile MAT.

7. The method according to claim 1 further comprising:
   scanning the first and/or second non-volatile MAT to identify the bad blocks therein starting above a lowermost block of the first and/or second non-volatile MAT to provide only a partial bad block scan of the first and/or second non-volatile MAT.

8. The method according to claim 7 wherein scanning further comprises:
   providing a starting block address for the partial bad block scan based on a predetermined offset from an uppermost block of the first and/or second non-volatile MAT based on a predetermined yield for the non-volatile memory.

9. The method according to claim 8 wherein scanning comprises:

sequentially examining data stored in each block above the starting block address until determining a first block indicated as bad based on the data read from the first block whereupon further scanning above the first block is avoided.

10. The method according to claim 7 wherein scanning comprises:
sequentially determining whether each block above the starting block address is bad until reaching an uppermost block in the first and/or second non-volatile MAT.

11. A non-volatile memory device comprising:
a first non-volatile MAT including first bad blocks address re-mapped to first replacement blocks; and
a second non-volatile MAT including second bad blocks address re-mapped to second replacement blocks, the second non-volatile MAT including blocks that are address mapped with blocks in the first non-volatile MAT, wherein the blocks in the second non-volatile MAT are sequentially address mapped immediately above a respective uppermost block in the first non-volatile MAT or immediately below a respective lowermost block in the first non-volatile MAT.

12. The non-volatile memory device according to claim 11 wherein the blocks in the first non-volatile MAT are interleaved address mapped with the blocks in the second non-volatile MAT.

13. A non-volatile memory device comprising:
a first non-volatile MAT including first bad blocks; and
a second non-volatile MAT including second bad blocks, wherein the first and second bad blocks are address re-mapped to first and second redundant blocks respectively in an uppermost portion of the second non-volatile MAT, wherein blocks in the second non-volatile MAT are sequentially address mapped immediately above a respective uppermost block in the first non-volatile MAT or immediately below a respective lowermost block in the first non-volatile MAT.

14. The non-volatile memory device according to claim 13 wherein blocks in the first non-volatile MAT are interleaved address mapped with blocks in the second non-volatile MAT.

15. The non-volatile memory device according to claim 13 further comprising:
a block replacement controller circuit configured to provide replacement signals, for control block selection in the first non-volatile MAT, to replacement blocks in the second non-volatile MAT during an access to the first non-volatile MAT.

16. The non-volatile memory device according to claim 13 further comprising:
a block replacement controller circuit configured to provide bad block replacement information for the bad blocks in the first non-volatile MAT to a block replacement controller circuit configured to provide bad block replacement information for the bad blocks in the second non-volatile MAT to control block selection for the second non-volatile MAT during an access to the first non-volatile MAT.

17. The non-volatile memory device according to claim 13 further comprising:
a bad block scanning circuit configured to identify the bad blocks in the first and/or second non-volatile MAT starting above a lowermost block of the first and/or second non-volatile MAT to provide only a partial bad block scan of the first and/or second non-volatile MAT.

18. The non-volatile memory device according to claim 17 wherein the bad block scanning circuit is further configured to provide a starting block address for the partial bad block scan based on a predetermined offset from an uppermost block of the first and/or second non-volatile MAT based on a predetermined yield for the non-volatile memory.

19. The non-volatile memory device according to claim 18 wherein the bad block scanning circuit is further configured to sequentially examine data stored in each block above the starting block address until determining a first block indicated as bad based on the data read from the first block whereupon further scanning above the first block is avoided.

20. The non-volatile memory device according to claim 18 wherein the bad block scanning circuit is further configured to sequentially determine whether each block above the starting block address is bad until reaching an uppermost block in the first and/or second non-volatile MAT.

21. An electronic system comprising:
a processor configured to coordinate operations of an electronic system;
a volatile memory, electrically coupled to the processor, configured to store and retrieve data responsive processor operations;
a system interface, electrically coupled to the processor, configured to provide communications between the processor and external systems; and
a non-volatile memory, electrically coupled to the processor, including at least one non-volatile memory device comprising:
a first non-volatile MAT including first bad blocks; and
a second non-volatile MAT including second bad blocks, wherein the first and second bad blocks are address re-mapped to first and second redundant blocks respectively in an uppermost portion of the second non-volatile MAT.

22. A memory card comprising:
a non-volatile memory controller configured to coordinate operations of the memory card; and
a non-volatile memory, electrically coupled to the non-volatile memory controller, including a non-volatile memory comprising:
a first non-volatile MAT including first bad blocks; and
a second non-volatile MAT including second bad blocks, wherein the first and second bad blocks are address re-mapped to first and second redundant blocks respectively in an uppermost portion of the second non-volatile MAT.

* * * * *